United States Patent
Nishita et al.

(10) Patent No.: US 10,613,435 B2
(45) Date of Patent: Apr. 7, 2020

(54) COATING SOLUTION FOR RESIST PATTERN COATING AND METHOD FOR FORMING PATTERN

(71) Applicant: NISSAN CHEMICAL INDUSTRIES, LTD., Tokyo (JP)

(72) Inventors: Tokio Nishita, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 115 days.

(21) Appl. No.: 15/562,817

(22) PCT Filed: Mar. 18, 2016

(86) PCT No.: PCT/JP2016/058741
§ 371 (c)(1),
(2) Date: Sep. 28, 2017

(87) PCT Pub. No.: WO2016/158507
PCT Pub. Date: Oct. 6, 2016

(65) Prior Publication Data
US 2018/0107111 A1     Apr. 19, 2018

(30) Foreign Application Priority Data

Mar. 31, 2015   (JP) ................ 2015-072895

(51) Int. Cl.
| | |
|---|---|
| *G03F 7/00* | (2006.01) |
| *H01L 21/027* | (2006.01) |
| *G03F 7/40* | (2006.01) |
| *C09D 133/06* | (2006.01) |
| *G03F 7/32* | (2006.01) |
| *G03F 7/42* | (2006.01) |
| *H01L 21/308* | (2006.01) |

(52) U.S. Cl.
CPC ....... *G03F 7/0035* (2013.01); *C09D 133/062* (2013.01); *G03F 7/32* (2013.01); *G03F 7/40* (2013.01); *G03F 7/405* (2013.01); *G03F 7/42* (2013.01); *H01L 21/027* (2013.01); *H01L 21/0273* (2013.01); *H01L 21/3086* (2013.01)

(58) Field of Classification Search
None
See application file for complete search history.

(56) References Cited

U.S. PATENT DOCUMENTS

| | | | |
|---|---|---|---|
| 2013/0183626 A1* | 7/2013 | Namiki | ........... G03F 7/40 430/325 |
| 2015/0118627 A1* | 4/2015 | Yamamoto | ........... G03F 7/0397 430/325 |
| 2016/0218013 A1 | 7/2016 | Ohashi et al. | |

FOREIGN PATENT DOCUMENTS

| | | | | |
|---|---|---|---|---|
| JP | 2008-102348 A | 5/2008 | | |
| JP | 2008-180813 A | 8/2008 | | |
| JP | 2008-249741 A | 10/2008 | | |
| JP | 2013-145290 A | 7/2013 | | |
| JP | 2013-257435 A | 12/2013 | | |
| JP | 2013257435 A | * 12/2013 | ........... | G03F 7/0397 |
| JP | 2014-071424 A | 4/2014 | | |
| JP | 2014-157299 A | 8/2014 | | |
| JP | WO 2015/030060 A1 | 3/2017 | | |

(Continued)

OTHER PUBLICATIONS

Jun. 14, 2016 Written Opinion issued in International Patent Application No. PCT/JP2016/058741.

(Continued)

*Primary Examiner* — Cachet I Proctor
(74) *Attorney, Agent, or Firm* — Oliff PLC

(57) ABSTRACT

A coating solution has a polymer having a formula (1) structural unit, a formula (2) primary, secondary, or tertiary amine, and a formula (3) ester capable of dissolving the polymer and amine:

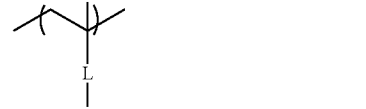

(1)

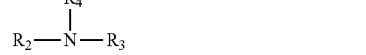

(2)

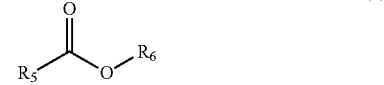

(3)

$R_1$ is a hydrogen atom or methyl group. L is a divalent aromatic group optionally having at least one substituent, —C(=O)—O— group, or —C(=O)—NH— group. The —C(=O)—O— or —C(=O)—NH— group carbon atom is attached to a polymer main chain. X is a hydrogen atom or linear or branched alkyl or alkoxy group having a 1-10 carbon atom number. At least one alkyl group hydrogen atom is optionally substituted with a halogen atom or hydroxy group. $R_2$, $R_3$, and $R_4$ are independently a hydrogen atom, hydroxy group, or linear, branched, or cyclic organic group having a 1-16 carbon atom number. $R_5$ and $R_6$ are each independently a linear or branched organic group having a 1-16 carbon atom number.

18 Claims, No Drawings

(56) References Cited

FOREIGN PATENT DOCUMENTS

WO        2015/037467 A1     3/2015
WO    WO-2015037467 A1 *  3/2015  ............... G03F 7/40

OTHER PUBLICATIONS

Jun. 14, 2016 International Search Report issued in International Application No. PCT/JP2016/058741.

* cited by examiner

COATING SOLUTION FOR RESIST PATTERN COATING AND METHOD FOR FORMING PATTERN

TECHNICAL FIELD

The present invention relates to a coating solution for resist pattern coating that can reduce the diameter of a hole pattern or the width of a trench pattern, and can expand the width of a line pattern. The present invention also relates to a method for forming a pattern and a method for forming a reversal pattern that use the coating solution.

BACKGROUND ART

Manufacture of semiconductor devices involves microfabrication by lithography using a resist composition. Microfabrication is a processing technique that includes forming a thin film of a photoresist composition on a semiconductor substrate such as a silicon wafer, irradiating the thin film with active light such as ultraviolet light through a mask pattern having a device pattern drawn thereon, developing the pattern, and etching the substrate using the resulting photoresist pattern as a protective film, thereby forming fine irregularities corresponding to the pattern on the substrate surface. As semiconductor devices have recently become further integrated, the active light used has also become shorter from an i-line (wavelength 365 nm) and a KrF excimer laser (wavelength 248 nm) to an ArF excimer laser (wavelength 193 nm). At present, lithography using EUV (abbreviation of extreme ultraviolet, wavelength 13.5 nm) exposure, which is an advanced microfabrication technology, is under study. Unfortunately, lithography using EUV exposure has not yet been put to practical use (mass production) for reasons such as a delay in the development of a high-power EUV light source.

Thus, various techniques have been studied to produce a finer pattern after using a conventional method for forming a resist pattern. A practical method among them is one in which a resist pattern formed within a range such that it can be stably obtained by a conventional method is covered with a composition for forming a fine pattern, and the resist pattern is expanded to reduce the diameter of the hole pattern (see Patent Documents 1 to 5).

PRIOR ART DOCUMENTS

Patent Documents

Patent Document 1: Japanese Patent Application Publication No. 2013-145290 (JP 2013-145290 A)
Patent Document 2: Japanese Patent Application Publication No. 2014-071424 (JP 2014-071424 A)
Patent Document 3: Japanese Patent Application Publication No. 2008-249741 (JP 2008-249741 A)
Patent Document 4: Japanese Patent Application Publication No. 2008-102348 (JP 2008-102348 A)
Patent Document 5: Japanese Patent Application Publication No. 2008-180813 (JP 2008-180813 A)

SUMMARY OF THE INVENTION

Problem to be Solved by the Invention

Thermal shrinkage is utilized in the coating agent for forming a finer pattern described in Patent Document 1 or the composition for forming a fine pattern described in Patent Document 2 obtained using a resin dissolved in an organic solvent, which is to be applied onto a pattern fabricated by a negative development process. Thus, these compositions for forming finer patterns need to be heat-treated at 130° C. or higher after being applied onto a resist pattern. The heat treatment requires a heating temperature equal to or higher than the temperature for performing post-exposure bake (PEB) on a hot plate after exposure of the resist to light. This may degrade the shape of the pattern fabricated. On the other hand, the reduced size of the pattern depends on the chemical structure of the resin, and is difficult to control.

In each of the methods for forming fine patterns described in Patent Documents 3 to 5, an aqueous solution is used as a coating agent for forming a finer pattern or a resist substrate-treating liquid. If the same cup is used to perform the resist film-forming step or the development step and the step of applying the coating agent for forming a finer pattern or the resist substrate-treating liquid as an aqueous solution onto the resist pattern, a developing solution in which a resist composition is dissolved mixes with the coating agent for forming a finer pattern or the resist substrate-treating liquid within the cup. This causes the resin and the like to be precipitated. It is thus necessary to use separate cups to perform the resist film-forming step or the development step and the step of applying the coating agent for forming a finer pattern or the resist substrate-treating liquid onto the resist pattern. This leads to a decreased throughput.

In view of the problem as described above, an object of the present invention is to provide a coating solution for resist pattern coating that can form a pattern finer than those obtained with conventional compositions for forming fine patterns, and allows the reduction width of the pattern size to be readily controlled, and simultaneously has excellent compatibility with general photoresist compositions, the coating solution for resist pattern coating being obtained by adding a specific amine. Another object of the present invention is to provide a method for forming a pattern and a method for forming a reversal pattern that use the coating solution.

Means for Solving the Problem

A first aspect of the present invention provides:
a coating solution for resist pattern coating comprising a polymer having a structural unit of the following formula (1), a primary, secondary, or tertiary amine of the following formula (2), and an ester of the following formula (3) capable of dissolving the polymer and the amine:

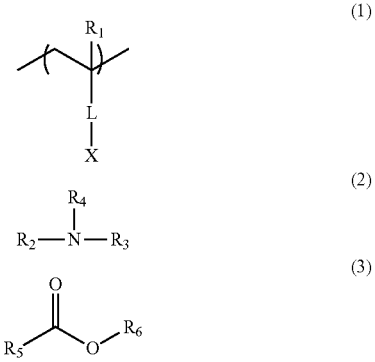

[(in formula (1), $R_1$ is a hydrogen atom or methyl group; L is a divalent aromatic group optionally having at least one substituent, —C(=O)—O— group, or —C(=O)—NH— group, wherein the carbon atom of the —C(=O)—O— group or the —C(=O)—NH— group is attached to a main chain of the polymer; and X is a hydrogen atom or alkyl or alkoxy group having a carbon atom number of 1 to 10, wherein at least one hydrogen atom of the alkyl group is optionally substituted with a halogen atom or hydroxy group);

(in formula (2), $R_2$, $R_3$, and $R_4$ are each independently a hydrogen atom, hydroxy group, or a linear, branched, or cyclic organic group having a carbon atom number of 1 to 16);

(in formula (3), $R_5$ and $R_6$ are each independently a linear or branched organic group having a carbon atom number of 1 to 16)].

In the first aspect of the present invention, the polymer is, for example, a copolymer having at least two types of structural units of formula (1) above, and the copolymer has a structural unit wherein L is a divalent aromatic group optionally having at least one substituent, and a structural unit wherein L is —C(=O)—O— group and/or a structural unit wherein L is —C(=O)—NH— group. The divalent aromatic group is phenylene group or naphthylene group, for example.

A second aspect of the present invention provides a method for forming a hole pattern, a trench pattern, or a line pattern comprising the steps of forming a resist pattern on a substrate having an underlayer film formed thereon; applying the coating solution for resist pattern coating according to the first aspect of the present invention to coat the resist pattern; heating the substrate coated with the coating solution for resist pattern coating at 50 to 130° C.; and cooling the heated substrate, and developing with an organic solvent to form a film coating a surface of the resist pattern.

In the second aspect of the present invention, after the development, rinsing may be performed with a rinsing solution.

A third aspect of the present invention provides a method for forming a reversal pattern comprising the steps of applying a coating solution for filling comprising a polysiloxane and a solvent containing water and/or an alcohol to fill the hole pattern or the trench pattern formed by the method according to the second aspect of the present invention or fill a space between patterns of the line pattern formed by the method according to the second aspect of the present invention; removing or reducing a component other than the polysiloxane contained in the coating solution for filling to form a coating film; exposing an upper surface of the hole pattern, the trench pattern, or the line pattern by etching back the coating film; and removing the hole pattern, the trench pattern, or the line pattern whose upper surface is exposed.

Effects of the Invention

A finer pattern can be formed by expanding a resist pattern using the coating solution for resist pattern coating of the present invention. The coating solution for resist pattern coating of the present invention contains an added specific amine, so that it can form a pattern finer than those obtained with conventional compositions for forming fine patterns, and allows the reduction width of the pattern size to be readily controlled. Simultaneously, the coating solution for resist pattern coating of the present invention has excellent compatibility with general photoresist compositions, i.e., solids are not precipitated even if the photoresist composition mixes with the coating solution for resist pattern coating of the present invention. This reduces the possibility of pipe clogging, leading to efficient manufacture of semiconductor devices. Furthermore, if EUV exposure is put to practical use in the future, a resist pattern fabricated using EUV exposure can be made even finer.

MODES FOR CARRYING OUT THE INVENTION

<Polymer>

The polymer having a structural unit of formula (1) above contained in the coating solution for resist pattern coating of the present invention has a weight average molecular weight of 1000 to 20000, for example. The polymer is non-water soluble. The "non-water soluble polymer" as used herein is defined as a polymer other than water-soluble polymers, which polymer undergoes phase separation when it forms a mixture with water under 1 atm at 20° C. Examples of such non-water soluble polymers include homopolymers or copolymers having structural units of the following formulas (a-1) to (a-30):

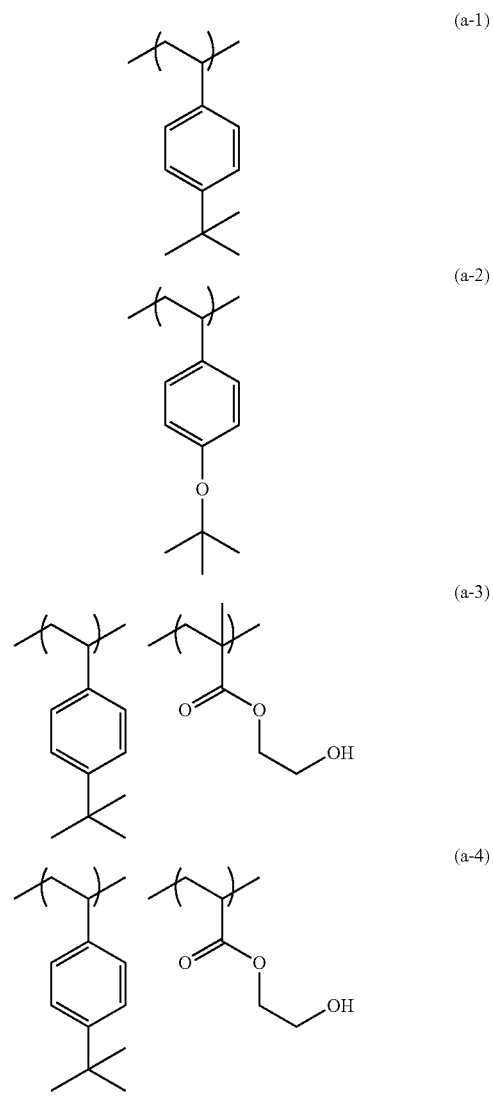

(a-5)
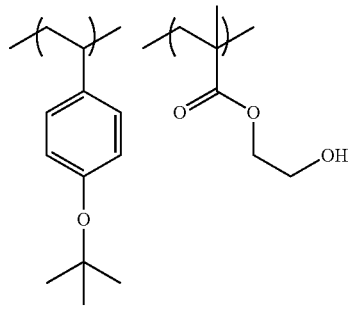
(a-6)
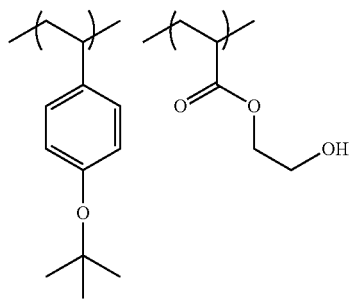
(a-7)
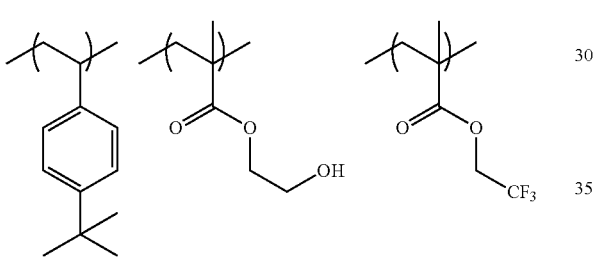
(a-8)
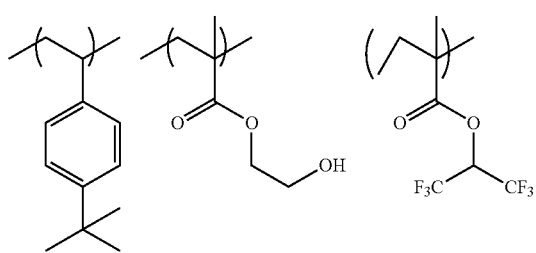
(a-9)
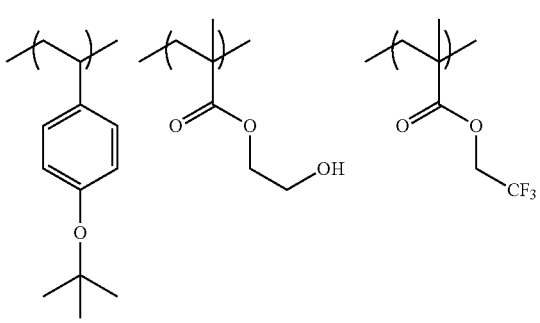
(a-10)
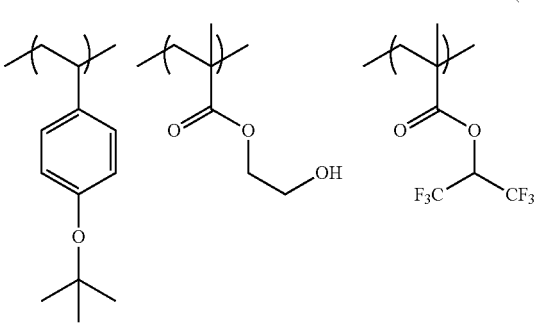
(a-11)
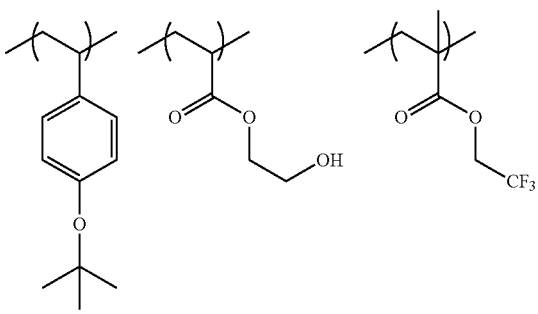
(a-12)
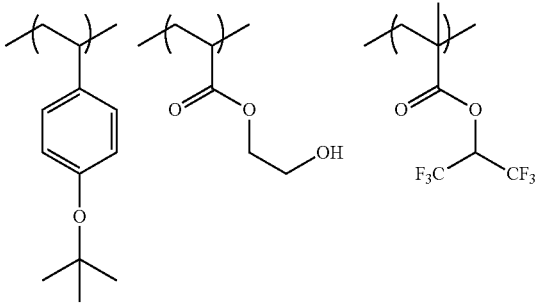
(a-13)
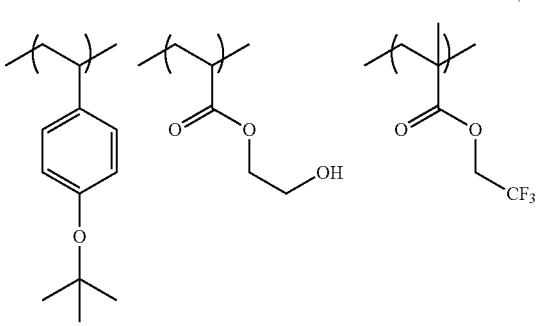

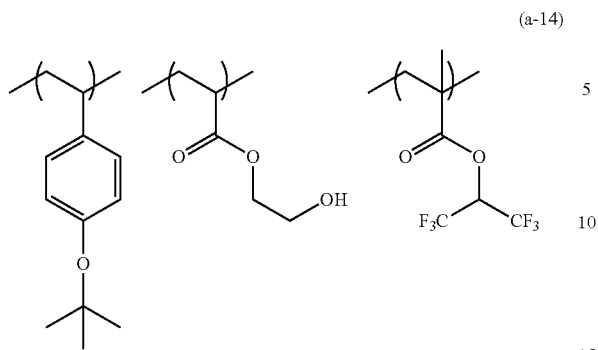
(a-14)
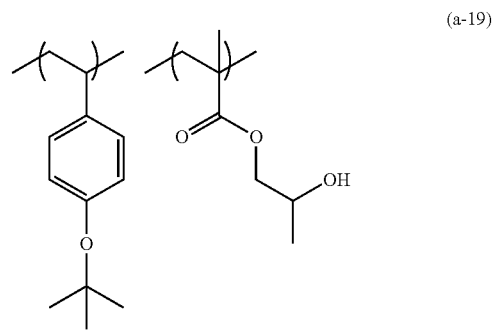
(a-19)
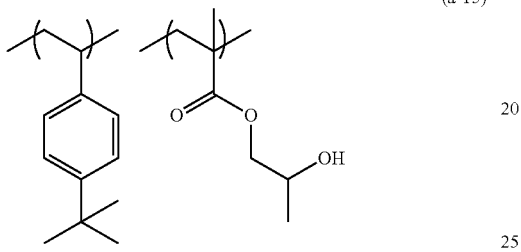
(a-15)
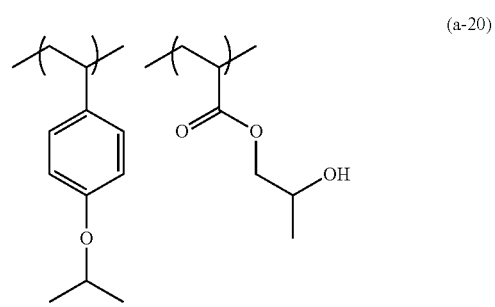
(a-20)
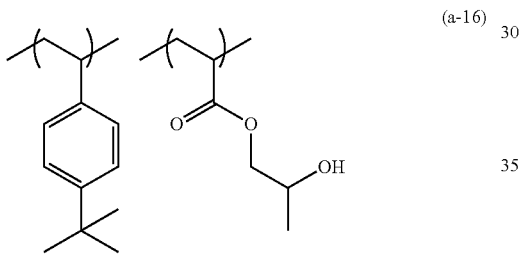
(a-16)
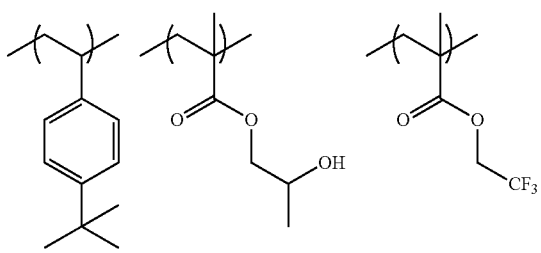
(a-21)
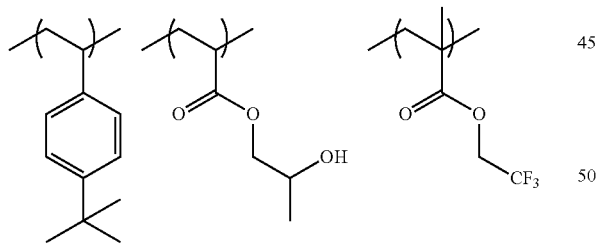
(a-17)
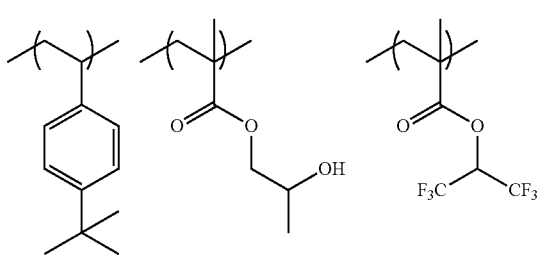
(a-22)
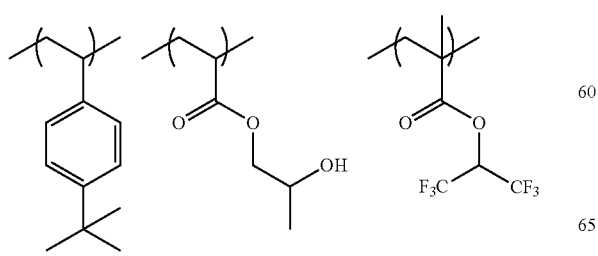
(a-18)
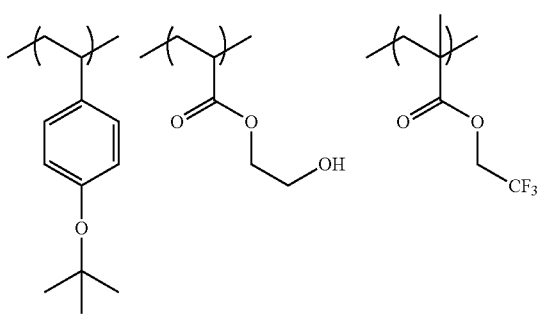
(a-23)

(a-24)
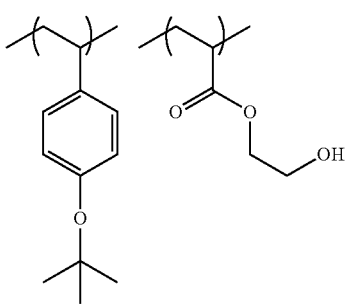

(a-25)
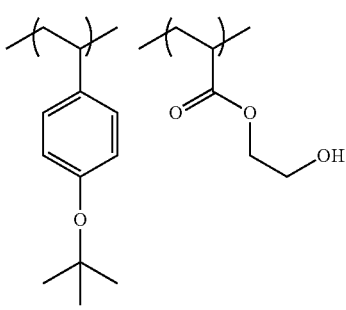

(a-26)
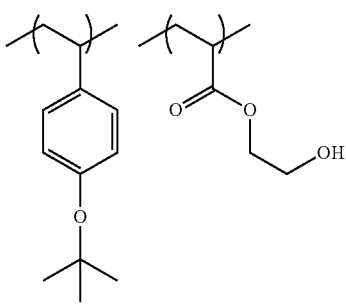

(a-27)
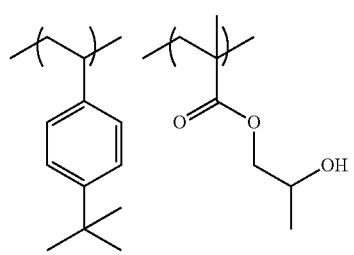

(a-28)
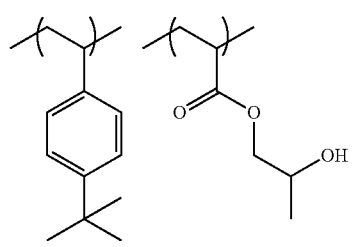

(a-29)
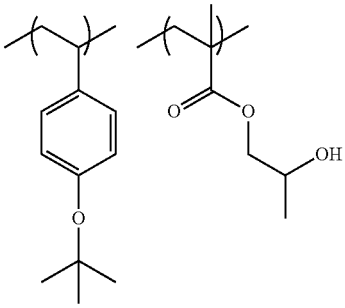

(a-30)
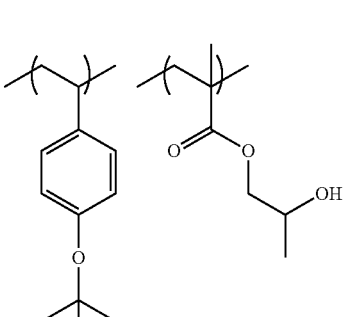

The content of the polymer in the coating solution for resist pattern coating of the present invention is 0.5 to 30% by mass, for example, and preferably 2 to 15% by mass, relative to 100% by mass of the coating solution.

<Amine>

The primary, secondary, or tertiary amine of formula (2) above contained in the coating solution for resist pattern coating of the present invention may be either in a liquid or solid state at room temperature. Examples of the amine include N-methylethanolamine, α-[2-(methylamino)ethyl] benzyl alcohol, 1-acetamidonaphthalene, bis(4-tert-butylphenyl)amine, N,N-bis(2-hydroxyethyl)-3-chloroaniline, bis(4-iodophenyl)amine, bis(2-pyridylmethyl)amine, bis(3-pyridylmethyl)amine, N-(tert-butoxycarbonyl)tyramine, N-carbobenzoxyhydroxylamine, 5-chloro-2-nitrodiphenylamine, N-cinnamoyl-N-(2,3-xylyl)hydroxylamine, cumylamine, cyclododecylamine, cycloheptylamine, 1-acetamidoadamantane, O-acetyl-N-carbobenzoxyhydroxylamine, N-acetyl-3,5-dimethyl-1-adamantanamine, N-acetyl-2-(4-nitrophenyl)ethylamine, 1-adamantanamine, N-allylbenzylamine, and 2-(dimethylamino)ethanol. These amines may be contained alone or in combination of two or more. The amine contained in the coating solution for resist pattern coating of the present invention is preferably an amine having a normal boiling point of 60 to 300° C., which is highly effective in reducing the diameter of the hole pattern, for example.

The content of the amine in the coating solution for resist pattern coating of the present invention is 0.5 to 80% by mass, for example, and preferably 20 to 60% by mass, relative to 100% by mass of the polymer in the coating solution.

<Ester>

The ester of formula (3) above contained in the coating solution for resist pattern coating of the present invention may be any ester capable of dissolving the non-water soluble polymer and amine. Examples of the ester include butyl acetate, isobutyl acetate, tert-butyl acetate, sec-butyl acetate, propylene glycol monomethyl ether acetate, ethylene glycol monoethyl ether acetate, diethylene glycol monobutyl ether acetate, diethylene glycol monoethyl ether acetate, 3-methoxybutyl acetate, 3-methyl-3-methoxybutyl acetate, ethyl lactate, butyl lactate, and propyl lactate. These esters may be contained alone or in combination of two or more.

The content of the ester in the coating solution for resist pattern coating of the present invention is 95 to 70% by mass, for example, and preferably 98 to 85% by mass, relative to 100% by mass of the coating solution.

<Other Additives>

The coating solution for resist pattern coating of the present invention may further contain various additives such as a surfactant and the like, as required, as long as it does not impair the effects of the present invention. The surfactant is an additive for improving the coatability of the composition on the substrate. Known surfactants such as nonionic surfactants and fluorosurfactants can be used.

Specific examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether; polyoxyethylene alkyl aryl ethers such as polyoxyethylene octylphenyl ether and polyoxyethylene nonylphenyl ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorosurfactants such as EFTOP [registered trademark] EF301, EF303 and EF352 [from Mitsubishi Materials Electronic Chemicals Co., Ltd.], MEGAFACE [registered trademark] F171, F173, R-30, R-40 and R-40-LM (from DIC Corporation), Fluorad FC430 and FC431 (from Sumitomo 3M Co., Ltd.), AsahiGuard [registered trademark] AG710, Surflon [registered trademark] S-382, SC101, SC102, SC103, SC104, SC105 and SC106 (from Asahi Glass Co., Ltd.); and organosiloxane polymer KP341 (from Shin-Etsu Chemical Co., Ltd.). These surfactants may be added alone or in combination of two or more.

When the coating solution for resist pattern coating of the present invention contains any of the above-mentioned surfactants, the content of the surfactant is 0.1 to 5% by mass, for example, and preferably 0.2 to 3% by mass, relative to 100% by mass of the polymer in the coating solution.

EXAMPLES

The weight average molecular weight of the polymer obtained in each of Synthesis Examples 1 to 4 hereinbelow is a measured result of gel permeation chromatography (hereinafter abbreviated to GPC). The measurement was performed using a GPC apparatus from Tosoh Corporation, under the following measurement conditions:

Measurement apparatus: HLC-8020GPC [trade name] (from Tosoh Corporation)

GPC columns: TSKgel [registered trademark] G2000HXL; 2 columns; TSKgel G3000HXL; 1 column; and TSKgel G4000HXL; 1 column (all from Tosoh Corporation)

Column temperature: 40° C.
Solvent: tetrahydrofuran (THF)
Flow rate: 1.0 mL/min
Standard sample: polystyrene (from Tosoh Corporation)

Synthesis Example 1

In 53.7 g of ethyl lactate, 24.5 g of tert-butylstyrene (from Tokyo Chemical Industry Co., Ltd.), 5.5 g of hydroxypropyl methacrylate (from Tokyo Chemical Industry Co., Ltd.), and 1.57 g of azobisisobutyronitrile (from Tokyo Chemical Industry Co., Ltd.) were dissolved. The solution was slowly added dropwise to 125.2 g of ethyl lactate heated to reflux. After the dropwise addition, the solution was heated to reflux at 160° C. and reacted for 24 hours to give a solution containing the polymer. The reaction solution was precipitated in 2000 g of a water/methanol mixed solvent. The resulting white solid was filtered and then dried under reduced pressure overnight at 60° C. to give a white polymer. GPC analysis revealed that this polymer had a weight average molecular weight of 2212 relative to standard polystyrene. The resulting polymer is presumed to be a copolymer having a structural unit of the following formula (a-27):

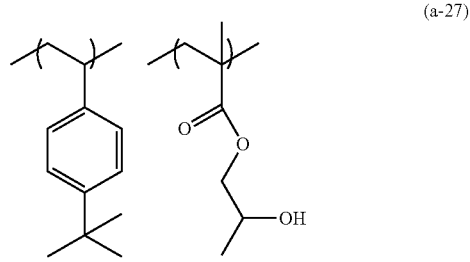

(a-27)

Synthesis Example 2

In 53.5 g of ethyl lactate, 14.1 g of tert-butylstyrene (from Tokyo Chemical Industry Co., Ltd.), 7.61 g of hydroxypropyl methacrylate (from Tokyo Chemical Industry Co., Ltd.), 8.3 g of 1,1,1,3,3,3-hexafluoroisopropyl methacrylate (from Tokyo Chemical Industry Co., Ltd.), and 1.44 g of azobisisobutyronitrile (from Tokyo Chemical Industry Co., Ltd.) were dissolved. The solution was slowly added dropwise to 124.7 g of ethyl lactate heated to reflux. After the dropwise addition, the solution was heated to reflux at 160° C. and reacted for 24 hours to give a solution containing the polymer. The reaction solution was precipitated in 2000 g of a water/methanol mixed solvent. The resulting white solid was filtered and then dried under reduced pressure overnight at 60° C. to give a white polymer. GPC analysis revealed that this polymer had a weight average molecular weight of 1847 relative to standard polystyrene. The resulting polymer is presumed to be a copolymer having a structural unit of the following formula (a-22):

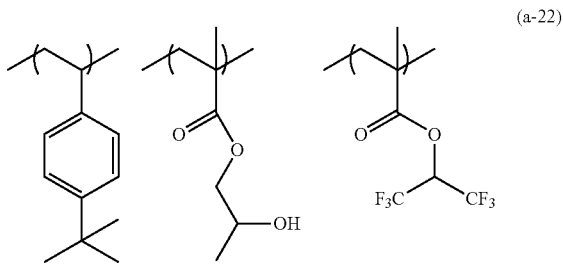

(a-22)

Example 1

To 0.93 g of the polymer obtained in Synthesis Example 1, 0.47 g of N-methylethanolamine (from Tokyo Chemical Industry Co., Ltd.) and 18.6 g of butyl acetate were added to dissolve the mixture. The solution was then filtered through a polyethylene microfilter with a pore size of 0.05 μm to prepare a coating solution for resist pattern coating.

Example 2

To 0.86 g of the polymer obtained in Synthesis Example 2, 034 g of N-methylethanolamine (from Tokyo Chemical Industry Co., Ltd.) and 18.8 g of butyl acetate were added to dissolve the mixture. The solution was then filtered through a polyethylene microfilter with a pore size of 0.05 μm to prepare a coating solution for resist pattern coating.

Example 3

To 0.93 g of the polymer obtained in Synthesis Example 2, 0.47 g of α-[2-(methylamino)ethyl]benzyl alcohol (from Tokyo Chemical Industry Co., Ltd.) and 18.6 g of butyl acetate were added to dissolve the mixture. The solution was then filtered through a polyethylene micro filter with a pore size of 0.05 μm to prepare a coating solution for resist pattern coating.

Comparative Example 1

To 1.00 g of the polymer obtained in Synthesis Example 2, 0.50 g of 1-butanol (from Tokyo Chemical Industry Co., Ltd.) and 13.5 g of butyl acetate were added to dissolve the mixture. The solution was then filtered through a polyethylene microfilter with a pore size of 0.05 μm to prepare a coating solution for resist pattern coating.

[Formation of Photoresist Pattern]

ARC [registered trademark] 29A (from Nissan Chemical Industries, Ltd.) was applied onto a silicon wafer with a spinner. The silicon wafer was placed on a hot plate and heated at 205° C. for 1 minute to form a resist underlayer film with a film thickness of 80 nm. A negative resist was applied onto the resist underlayer film with a spinner, followed by heating on the hot plate to form a photoresist film (film thickness 0.10 μm).

The photoresist film was subsequently exposed to light through a photomask, using a scanner (NSR-S307E (wavelength 193 nm, NA: 0.85, σ: 0.65/0.93) from Nikon Corporation). The photomask was selected in accordance with the resist pattern to be formed. After the exposure to light, the photoresist film was subjected to post-exposure bake (PEB) on the hot plate. After cooling, the photoresist film was developed by an industrial standard 60-second single paddle-type process, using butyl acetate as a developing solution. Through the above-described steps, a contact-hole pattern as the target resist pattern was formed. The formed contact-hole pattern was measured for diameter.

[Process for Reducing Size of Contact-Hole Pattern]

Each of the coating solutions for resist pattern coating prepared in Examples 1 to 3 of the present invention and Comparative Example 1 was applied with a spinner onto the resist pattern (contact-hole pattern in which the pattern diameter:the space between adjacent patterns=1:3) formed on the silicon wafer. The coating was baked at 100° C. and then developed using butyl acetate as a developing solution. The developed contact-hole pattern was measured for diameter based on an SEM (scanning electron microscope) image of the upper surface of the pattern, and the diameter was compared with the diameter of the contact-hole pattern before the application of the coating solution for resist pattern coating. The results are shown in Table 1.

TABLE 1

| | Diameter of Contact-Hole Pattern/nm | | |
|---|---|---|---|
| | before Treatment | after Treatment | Difference/nm |
| Example 1 | 108.8 | 77.1 | 31.7 |
| Example 2 | 105.7 | 88.5 | 17.2 |
| Example 3 | 104.9 | 92.3 | 12.6 |
| Comparative Example 1 | 104.5 | 105.4 | −1.1 |

The results shown in Table 1 reveal that the diameter of the contact-hole pattern could be reduced by using each of the coating solutions for resist pattern coating prepared in Examples 1 to 3. In contrast, the diameter of the contact-hole pattern could not be reduced by using the coating solution for resist pattern coating prepared in Comparative Example 1.

The invention claimed is:

1. A coating solution for resist pattern coating comprising a polymer having a structural unit of the following formula (1), an amine selected from the group consisting of N-methylethanolamine, α-[2-(methylamino)ethyl]benzyl alcohol, 1-acetamidonaphthalene, bis(4-tert-butylphenyl)amine, N,N-bis(2-hydroxyethyl)-3-chloroaniline, bis(4-iodophenyl)amine, bis(2-pyridylmethyl)amine, bis(3-pyridylmethyl)amine, N-(tert-butoxycarbonyl)tyramine, N-carbobenzoxyhydroxylamine, 5-chloro-2-nitrodiphenylamine, N-cinnamoyl-N-(2,3-xylyl)hydroxylamine, cumylamine, cyclododecylamine, cycloheptylamine, 1-acetamidoadamantane, O-acetyl-N-carbobenzoxyhydroxylamine, N-acetyl-3,5-dimethyl-1-adamantanamine, N-acetyl-2-(4-nitrophenyl)ethylamine, 1-adamantanamine, N-allylbenzylamine, and 2-(dimethylamino)ethanol, and an ester of the following formula (3) capable of dissolving the polymer and the amine:

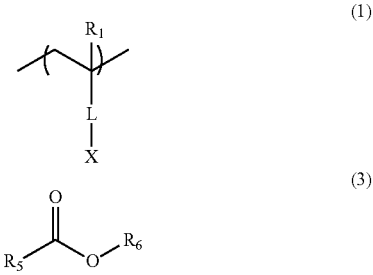

in formula (1), $R_1$ is a hydrogen atom or methyl group; L is a divalent aromatic group optionally having at least one substituent, —C(=O)—O— group, or —C(=O)—NH— group, wherein the carbon atom of the —C(=O)—O— group or the —C(=O)—NH— group is attached to a main chain of the polymer; and X is a hydrogen atom or a linear or branched alkyl or alkoxy group having a carbon atom number of 1 to 10, wherein at least one hydrogen atom of the alkyl group is optionally substituted with a halogen atom or hydroxy group; and in formula (3), $R_5$ and $R_6$ are each independently a linear or branched organic group having a carbon atom number of 1 to 16.

2. The coating solution for resist pattern coating according to claim 1, wherein the polymer has a weight average molecular weight of 1000 to 20000.

3. The coating solution for resist pattern coating according to claim 1, wherein the polymer is a copolymer having at least two types of structural units of formula (1) above, and the copolymer has a structural unit wherein L is a divalent aromatic group optionally having at least one substituent, and a structural unit wherein L is —C(=O)—O— group and/or a structural unit wherein L is —C(=O)—NH— group.

4. The coating solution for resist pattern coating according to claim 1, wherein the divalent aromatic group is phenylene group or naphthylene group.

5. The coating solution for resist pattern coating according to claim 1, wherein the polymer is a non-water soluble polymer.

6. The coating solution for resist pattern coating according to claim 1, wherein the amine has a normal boiling point of 60 to 300° C.

7. The coating solution for resist pattern coating according to claim 1, wherein the ester is butyl acetate.

8. A method for forming a hole pattern, a trench pattern, or a line pattern comprising the steps of:
forming a resist pattern on a substrate having an underlayer film formed thereon;
applying the coating solution for resist pattern coating according to claim 1 to coat the resist pattern;
heating the substrate coated with the coating solution for resist pattern coating at 50 to 130° C.; and
cooling the heated substrate, and developing with an organic solvent to form a film coating a surface of the resist pattern.

9. The method for forming a hole pattern, a trench pattern, or a line pattern according to claim 8, wherein, after the development, rinsing is performed with a rinsing solution.

10. A method for forming a reversal pattern comprising the steps of:

applying a coating solution for filling comprising a polysiloxane and a solvent containing water and/or an alcohol to fill the hole pattern or the trench pattern formed by the method according to claim 8 or fill a space between patterns of the line pattern formed by the method according to claim 8;
removing or reducing a component other than the polysiloxane contained in the coating solution for filling to form a coating film;
exposing an upper surface of the hole pattern, the trench pattern, or the line pattern by etching back the coating film; and
removing the hole pattern, the trench pattern, or the line pattern whose upper surface is exposed.

11. The coating solution for resist pattern coating according to claim 1, wherein a content of the amine in the coating solution is 20 to 60% by mass, relative to 100% by mass of the polymer in the coating solution.

12. The coating solution for resist pattern coating according to claim 1, wherein the amine is 2-(dimethylamino) ethanol.

13. The coating solution for resist pattern coating according to claim 1, wherein the amine is N-methylethanolamine.

14. The coating solution for resist pattern coating according to claim 1, wherein the amine is α-[2-(methylamino) ethyl]benzyl alcohol.

15. The coating solution for resist pattern coating according to claim 1, wherein the amine selected from the group consisting of 1-acetamidoadamantane, N-acetyl-3,5-dimethyl-1-adamantanamine, and 1-adamantanamine.

16. The coating solution for resist pattern coating according to claim 1, wherein the amine selected from the group consisting of bis(2-pyridylmethyl)amine and bis(3-pyridylmethyl)amine.

17. The coating solution for resist pattern coating according to claim 1, wherein the amine selected from the group consisting of cyclododecylamine and cycloheptylamine.

18. The coating solution for resist pattern coating according to claim 1, wherein the amine selected from the group consisting of N,N-bis(2-hydroxyethyl)-3-chloroaniline, bis(4-iodophenyl)amine and 5-chloro-2-nitrodiphenylamine.

* * * * *